United States Patent [19]

Hooper et al.

[11] Patent Number: 5,175,696
[45] Date of Patent: Dec. 29, 1992

[54] RULE STRUCTURE IN A PROCEDURE FOR SYNTHESIS OF LOGIC CIRCUITS

[75] Inventors: Donald F. Hooper, Northboro; Snehamay Kundu, Marlboro, both of Mass.

[73] Assignee: Digital Equipment Corporation, Maynard, Mass.

[21] Appl. No.: 703,705

[22] Filed: May 21, 1991

Related U.S. Application Data

[63] Continuation of Ser. No. 391,670, Aug. 7, 1989, abandoned, which is a continuation of Ser. No. 907,512, Sep. 12, 1986, abandoned.

[51] Int. Cl.⁵ .............................................. G06F 15/60
[52] U.S. Cl. ..................................... 364/489; 364/488; 395/54; 395/921
[58] Field of Search ............... 364/488, 489, 490, 491; 395/10, 54, 600, 919, 921

[56] References Cited

U.S. PATENT DOCUMENTS

| | | | |
|---|---|---|---|
| T935,003 | 6/1975 | Linville et al. | 364/490 |
| 4,377,849 | 3/1983 | Finger et al. | 364/491 |
| 4,386,403 | 5/1983 | Hsieh et al. | 364/300 |
| 4,510,616 | 4/1985 | Lougheed et al. | 364/490 |
| 4,554,631 | 11/1985 | Reddington | 364/300 |
| 4,584,653 | 4/1986 | Chih et al. | 364/488 |
| 4,613,940 | 9/1986 | Shenton et al. | 364/488 |
| 4,700,317 | 10/1987 | Watanabe et al. | 364/488 |
| 4,703,435 | 10/1987 | Darringer et al. | 364/488 |

FOREIGN PATENT DOCUMENTS

| | | | |
|---|---|---|---|
| 0168650 | 1/1986 | European Pat. Off. | 364/489 |
| 1445914 | 8/1976 | United Kingdom | 364/490 |

OTHER PUBLICATIONS

"Logic Synthesis Through Local Transformations", Darringer et al. IBM Journal, vol. 25, No. 4, Jul. 1981, pp. 272-280.

D. L. Dietmeyer, "Logic Design of Digital Systems", Allynt Bacon, Boston 1978, pp. 156-238.

"Quality of Designs from an Automatic Logic Generator (ALERT)", Friedman et al., 7th DA Conference 1970, pp. 71-89.

"LORES—Logic Reorganization System", Nakamura et al., 15th DA Conference 1978, pp. 250-260.

"A New Look at Logic Synthesis", Darringer et al., 17th DA Conference 1980, pp. 543-549.

"Methods Used in an Automatic Logic Design Generator (ALERT)", Friedman et al., IEEE—Computer, vol. C-18, No. 7, Jul. 1969, pp. 593-610.

Daniel et al., "CAD Systems for IC Design", IEEE Computer-Aided Design of Integrated Circuits and Systems, vol. CAD-1, No. 1, Jan. 1982, pp. 2-11.

Trimberger, "Automating Chip Layout", IEEE Spectrum, vol. 19, No. 6, Jun. 1982, pp. 38-45.

(List continued on next page.)

Primary Examiner—Vincent N. Trans
Attorney, Agent, or Firm—Finnegan, Henderson, Farabow, Garrett and Dunner

[57] ABSTRACT

In a procedure for the synthesis of logic circuits in which the components of the logic circuits are replaced by model instances related to data files stored in the procedure data base, a rule structure is described that permits the synthesis of the logic circuit by testing the model instances through a process included in a first or antecedent portion of the rule, and in the event that the conditions of the rule are fulfilled, then the consequence portion of the rule is executed. The consequence portion of the rule can include the replacement of one or more model instances of the logic circuit with one or more different model instances while retaining the functional or logical equivalence between the instances before and after the application of the rule. The rule includes a field that permits automatic prioritization a plurality of rules. The rules are written in a format that is similar to normal grammatical construction and, therefore, easily learned.

12 Claims, 9 Drawing Sheets

OTHER PUBLICATIONS

Franco et al., "The Cell Design System", IEEE 18th Design Automation Conference, paper 12.4, 1981, pp. 240-247.

Kessler et al., "Standard Cell VLSI Design: A Tutorial", IEEE Circuit and Devices Magazine; Jan. 1985, pp. 17-34.

F. Hayes-Roth, "Rule-based Systems," Communications of the ACM, vol. 28, No. 9, pp. 921-932 (Sep., 1985).

D. Rine, "Some Applications of Multi-Valued Logic Architecture Design to Expert Systems," Proceedings of the First International Conference on Supercomputing Systems, St. Petersburg, FL, pp. 229-237 (Dec. 16-20, 1985).

H. Brown et al., "Palladio: An Exploratory Environment for Circuit Design," Computer, vol. 16, No. 12, pp. 41-56 (Dec., 1983).

T. Uehara, "A Knowledge-Based Logic Design System," IEEE Design & Test of Computers, vol. 2, No. 5, pp. 27-34 (Oct., 1985).

A. de Geus et al., "A Rule-Based System for Optimizing Combinational Logic," IEEE Design & Test of Computers, vol. 2, No. 4, pp. 22-31 (Aug., 1985).

C. L. Forgy, "OPS5 User's Manual," Carnegie-Mellon University (Jul., 1981).

Randy H. Katz, 'Managing the Chip Design Database', IEEE Computer, vol. 16, No. 12, Dec., 1983, pp. 26-35.

RULE STRUCTURE IN A PROCEDURE FOR SYNTHESIS OF LOGIC CIRCUITS

This application is a continuation of application Ser. No. 07/391,670, filed Aug. 7, 1989, now abandoned, which is a continuation of application Ser. No. 06/907,512, filed Sep. 12, 1986 now abandoned.

RELATED PUBLICATIONS

The following publications and U.S. Patent Applications are related documents to the instant Application:

Managing the Chip Design Database, by Randy H. Katz, IEEE Computer, Vol. 16, No. 12, December 1983, pages 26 through 35.

Common LISP: The Language, by Guy L. Steele Jr, 1984. The Digital Press, Maynard, Mass., U.S.A.

Procedure and Data Structures for Synthesis and Transformation of Logic Circuit Designs, invented by Donald F. Hooper et al. assigned to the same assignee named herein, having U.S. Ser. No. 907,303, filed Sep. 12, 1986.

Data Base Access Mechanism for Rules Utilized by a Synthesis Procedure for Logic Circuit Design, invented by Donald F. Hooper, assigned to the same assignee named herein, having U.S. Ser. No. 907,515, filed Sep. 12, 1986.

Rule Structure for Insertion of New Elements in a Circuit Design Synthesis Procedure, invented by Donald F. Hooper et al, assigned to the same assignee named herein, having Ser. No. 907,513, filed Sep. 12, 1986.

Bitwise Implementation Mechanism for a Circuit Design Synthesis Procedure, invented by Donald Hooper et al. assigned to the assignee named herein, having Ser. No. 907,516, filed Sep. 12, 1986.

BACKGROUND OF THE INVENTION

1. Field of the Invention

This invention relates generally to the design of data processing systems and similar logic structures, and more particularly to an automated design procedure that synthesizes a logic structure in a manner similar to the technique used by a design engineer.

2. Description of the Related Art

The design of digital logic circuits may be considered as a map of nodes and arcs, wherein the nodes are functional in nature and the arcs are connective in nature. For example, the functionality of a node may be that of an adder element, the adder element providing an output signals in response to input signals. The adder element may be technology independent which, in the present context, means that the adder element has no physical characteristics associated therewith and therefore does not define a digital device. The technology independent adder element is, however, functionally correct and can have attributes, such as a shape, for use in drawings, simulation behavior, equivalent gate count, etc. If a digital device, with a defined technology, were available that exactly matched the behavior and the interface characteristics of the adder element, then the digital device could be substituted for the technology independent adder in the design of the circuit. This technique is used in the automated design of digital logic circuits of the prior art where the transformation from technology independent to technology dependent design is accomplished by the substitution of previously designed elements defined by a predetermined technology.

Referring next to FIG. 1, the procedure for synthesizing a logic circuit design according to the prior art is shown. Model definition data structures from a library of component definitions is entered into the data structures associated with the synthesis data base in step 11. In step 12, the information related to the instances of the circuit design, including the connectivity information, is entered in the data base. The instances of the circuit design are generally in a behavioral or functional form when entered in the synthesis data base. The synthesis procedure relates the instances of the circuit design to the model instances in step 13. In step 14, a set of rules for the synthesis procedure is applied to each of the model instances and the model instances are altered and connected in such a way as to maximize certain parameters such as size, path delay, power, etc. In step 15, the resulting circuit design is placed in a format that can control the automated fabrication of the circuit.

The synthesis procedure of the prior art has several disadvantages. In particular, each individual replacement component or instance has a full set of design rules applied thereto, there being no provision to discard unrelated rules. In addition, the application of a rule typically results in a one to one replacement of circuit instances. A need has been felt for a synthesis procedure that does not apply inapplicable rules and which has a flexibility in replacement of instances during the procedure that is more analogous to the techniques used by design engineers. In particular, a need was felt for a synthesis procedure implemented with a rule structure that can be conveniently utilized and that does not require excessive interpretation.

FEATURES OF THE INVENTION

It is an object of the present invention to provide an improved procedure for the design of digital logic circuits.

It is a feature of the present invention to provide two hierarchical information structures, a first hierarchical information structure for logic synthesis rules and a second hierarchical structure for logic design data.

It is yet another feature of the present invention to provide a rule that can make a one-or-many to a one-or-many replacement of instances in a synthesis procedure.

It is a further feature of the present invention to provide a rule structure for automated design of logic circuits that includes an antecedent portion and a consequence portion.

It is still another object of the present invention to provide a rule structure for a synthesis procedure that resembles typical grammatical construction.

It is a still further feature of the present invention to provide prioritizing of possible circuit components in a design synthesis procedure rule structure.

SUMMARY OF THE INVENTION

The aforementioned and other features are obtained, according to the present invention, by providing a rule structure that is similar to ordinary grammar construction and can be used without excessive training. The rule file includes an antecedent portion, which provides a test of selected conditions, and a consequence portion, which defines a resulting activity in the event that the antecedent portion provides a positive result. A rule also includes a field that indicates a priority level to determine which activity is to be followed in the event a plurality of antecedents provide positive results. The rule structure further includes a field for data concerning the background of the associated field. The form of the antecedent and consequence rule portions are illustrated along with an illustration of the result of the execution of a rule.

These and other features of the present invention will be understood upon reading of the following description along with the drawings.

DESCRIPTION OF THE PREFERRED EMBODIMENT

1. Detailed Description of the Figures

Figure 1:
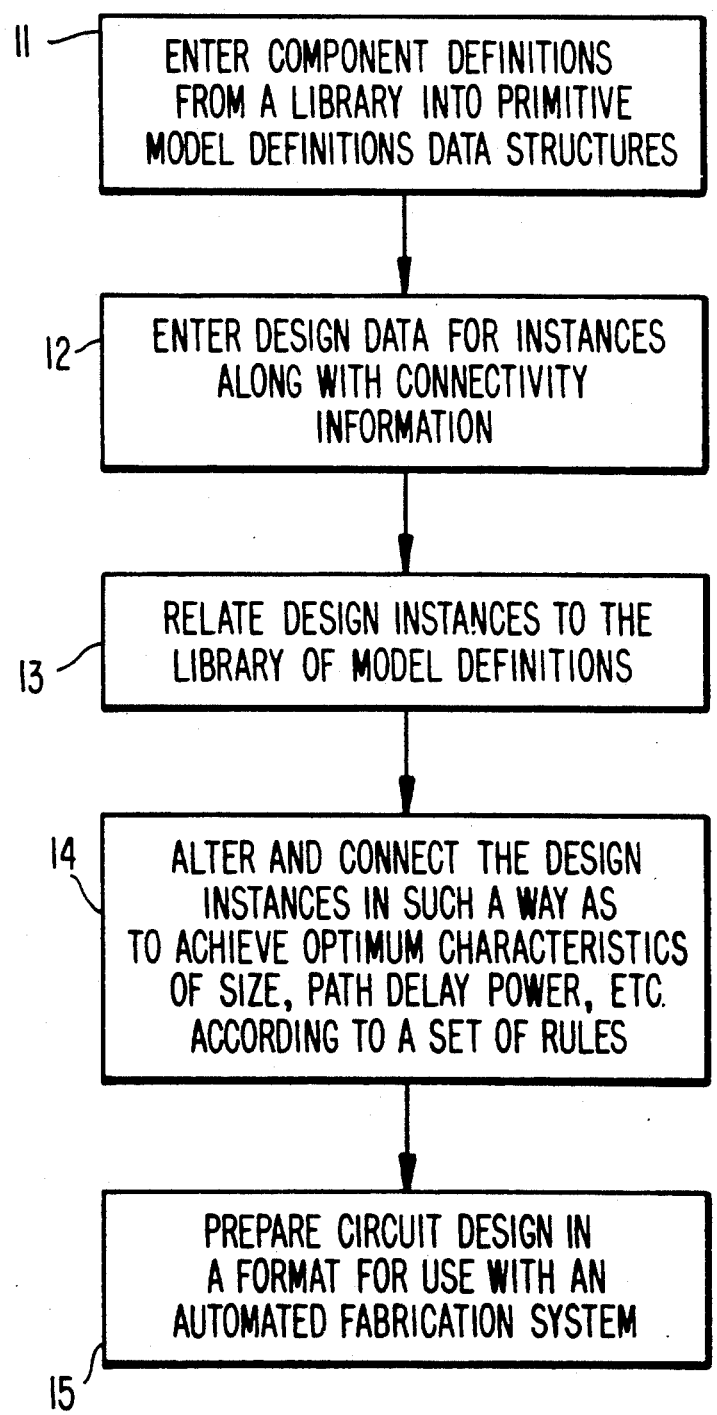
FIG. 1 is a flow diagram illustrating a procedure for synthesizing circuit designs according to the related art.

FIG. 1 has been described previously in relationship to the related art.

Figure 2:
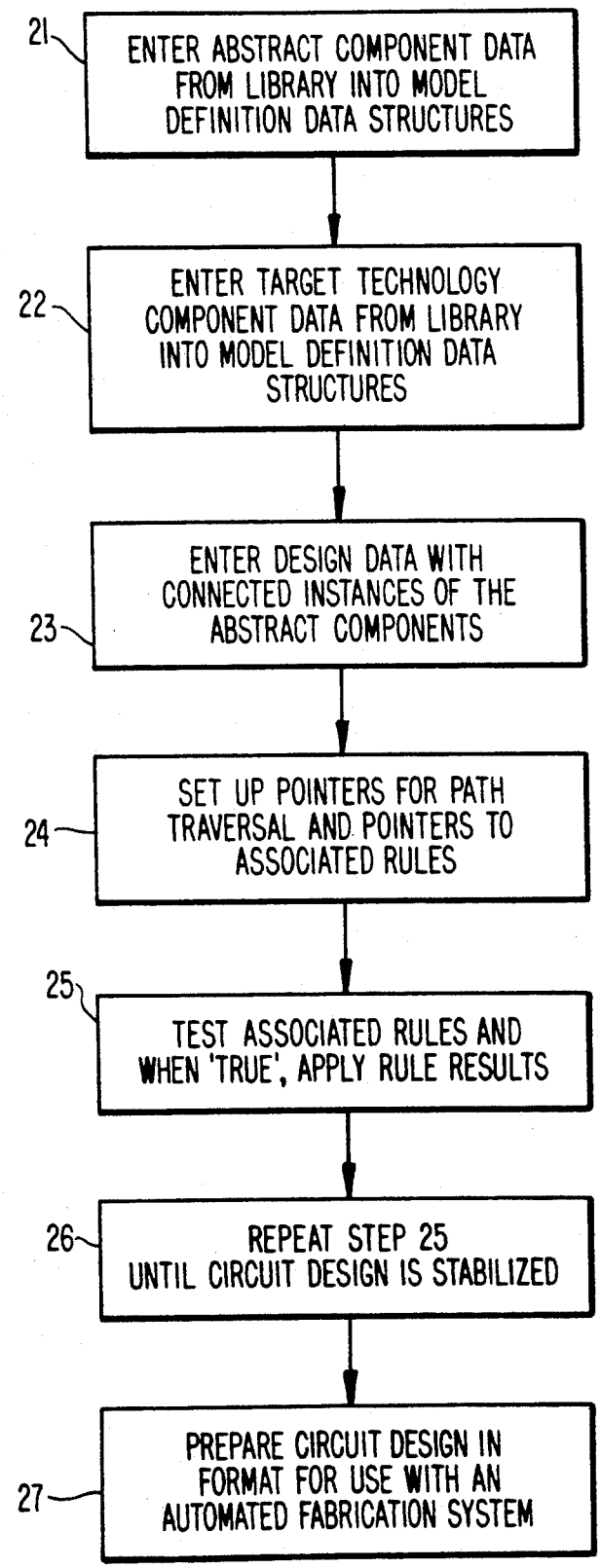
FIG. 2 is a flow diagram illustrating a procedure for synthesizing circuit designs with which the present invention is intended to be used.

Referring next to FIG. 2, the synthesis procedure of the present invention is shown. In step 21, abstract component data from a library of such data is entered into model definition data structures of the synthesis procedure. In step 22, component data from the LIBRARY relating to the target technology is entered into model definition data structures of the synthesis procedure. The circuit design data with the connected instances described in terms of abstract components is entered into the synthesis procedure in step 23. In step 24, the synthesis procedure provides two sets of pointers. The first set of pointers permits the synthesis procedure to follow any arbitrary path through the design circuit. The second set of pointers couples rules with associated data base structures. In step 25, the associated rules are tested for each model instance and when the test provides a 'true' result, the consequences of the rule is implemented. In the preferred embodiment, each rule has an antecedent portion and a consequence portion. The antecedent portion includes a test algorithm, and the consequence portion provides the information required to implement a result of the test. Because the rules are applied to instances in a sequential manner, and because in the preferred embodiment the test procedures can involve neighboring instances that can be changed as a result of a test applied to that instance, the process being repeated in step 26 until the circuit design has stabilized. In step 27, the final version of the circuit design is placed in a format suitable for use in an automated circuit fabrication system.

Figure 3:
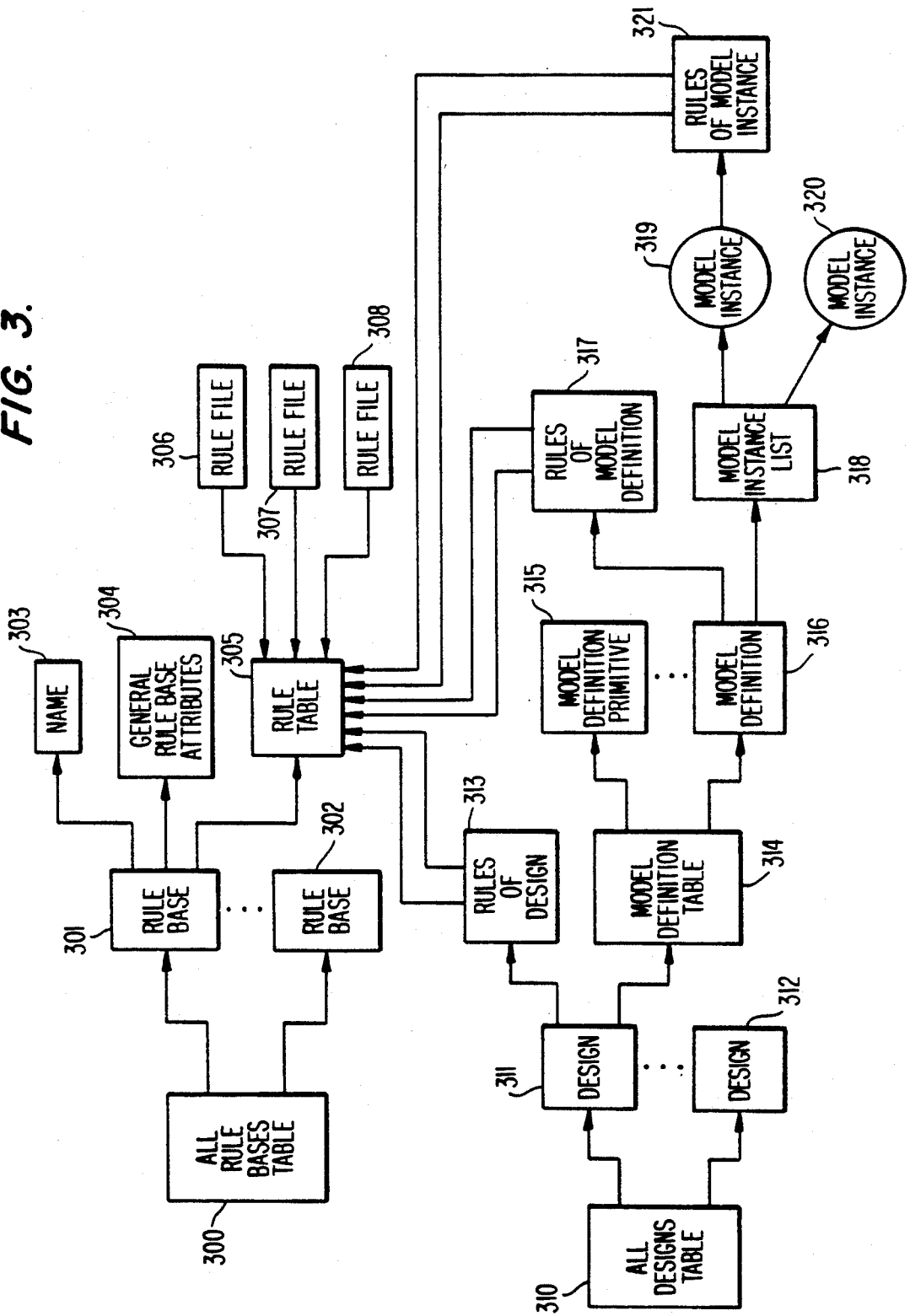
FIG. 3 is an overall diagram of the architecture for data structures of logic design and logic synthesis rules.

Referring now to FIG. 3, the architectural organization for the storage of the logic synthesis rules and the logic design rules are shown. Two storage hierarchies are available, one representing rule information and the second representing digital design information. These information hierarchies interact when pointers are established, relating the design objects to specific groups of rules. A rule file 306 through 308 is a collection of rules arbitrarily organized by the creator of the file. Several rule files can be transferred to a rule table 305. The rule table 305 is a lookup table that is indexed by the name of the rules stored therein. The rule table 305 is an attribute of a rule base 301 that has, in addition to the rules stored in rule table 305, a name 303 and other attributes 304 of the rule base. Any number of rule bases 301 through 302 are contained in the table of all rule bases 300. The all rule bases table 300 is a lookup table indexed by the name of the rule base. The all rule base table 300 is the top of the rule information hierarchy. The logic design data is partitioned into blocks, called model definitions 315 through 316. Any number of model definitions can be stored in the model definition table, a lookup table indexed by the model name. A model definition can contain a model instance list 318 that includes model instances 319 and 320 that can include model instances of other model definitions. For any functional part type or structural body of a given name, only one model definition can exist. However, any functional part type or structural body can have zero or more model instances. The attributes of the model definition are common to all of the instances associated therewith and, therefore, need to be stored only with the model definition. The model definition contains "LIBRARY" information. The attributes of the model instances, such as timing parameters and simulation values, are unique to each model instance and consequently must be stored with the associated instance. Those model definitions with no model instances or for which a "LIBRARY" attribute is specified are considered primitive model definitions stored in table 315. The model definition table 314 is stored in a design table 311, the design table being capable of possessing other attributes. Any number of designs 311 through 312 can be contained in the all designs table 310.

Figure 4:
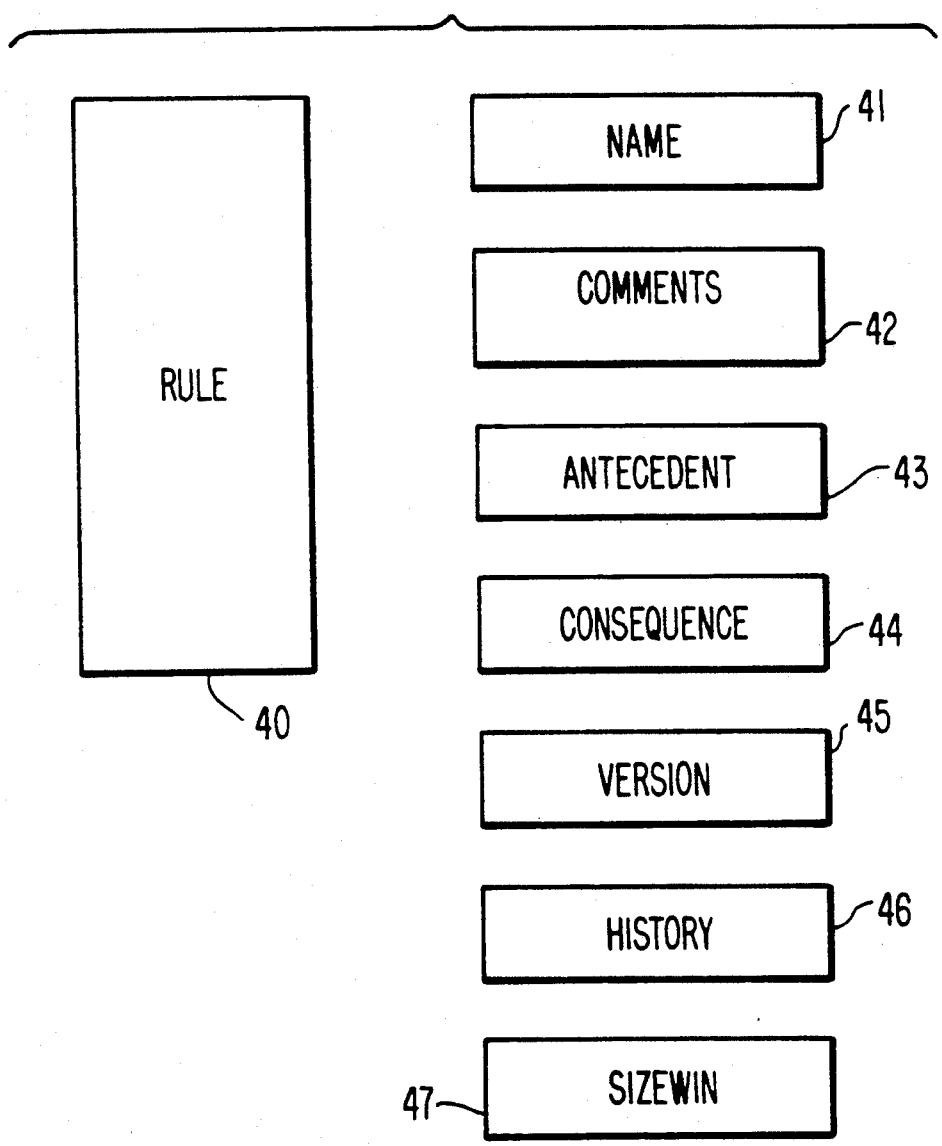
FIG. 4 is an illustration of the structure of a rule file according to the present invention.

Referring next to FIG. 4, the general structure of a rule 40 used in the logic network synthesis is shown. At rule file read time, the structure is created for each rule 40. A location in the file is reserved for the name field 41 of the rule. Another location is reserved for comments file 42, comments being formal notations concerning the use of the rule. Antecedents field 43, consequences field 44, version field 45, history field 46 and sizewin field 47 are fields within the rule structure. The antecedent field 43 and the consequence field 44 are described below. The version field 45 includes version information from a host computer aided design (CAD) data management system, when available, or time-of-day and date information, when available. The history field 46 is initially set to zero and is subsequently used to keep a running count of the number of times the associated rule is applied.

Figure 5:
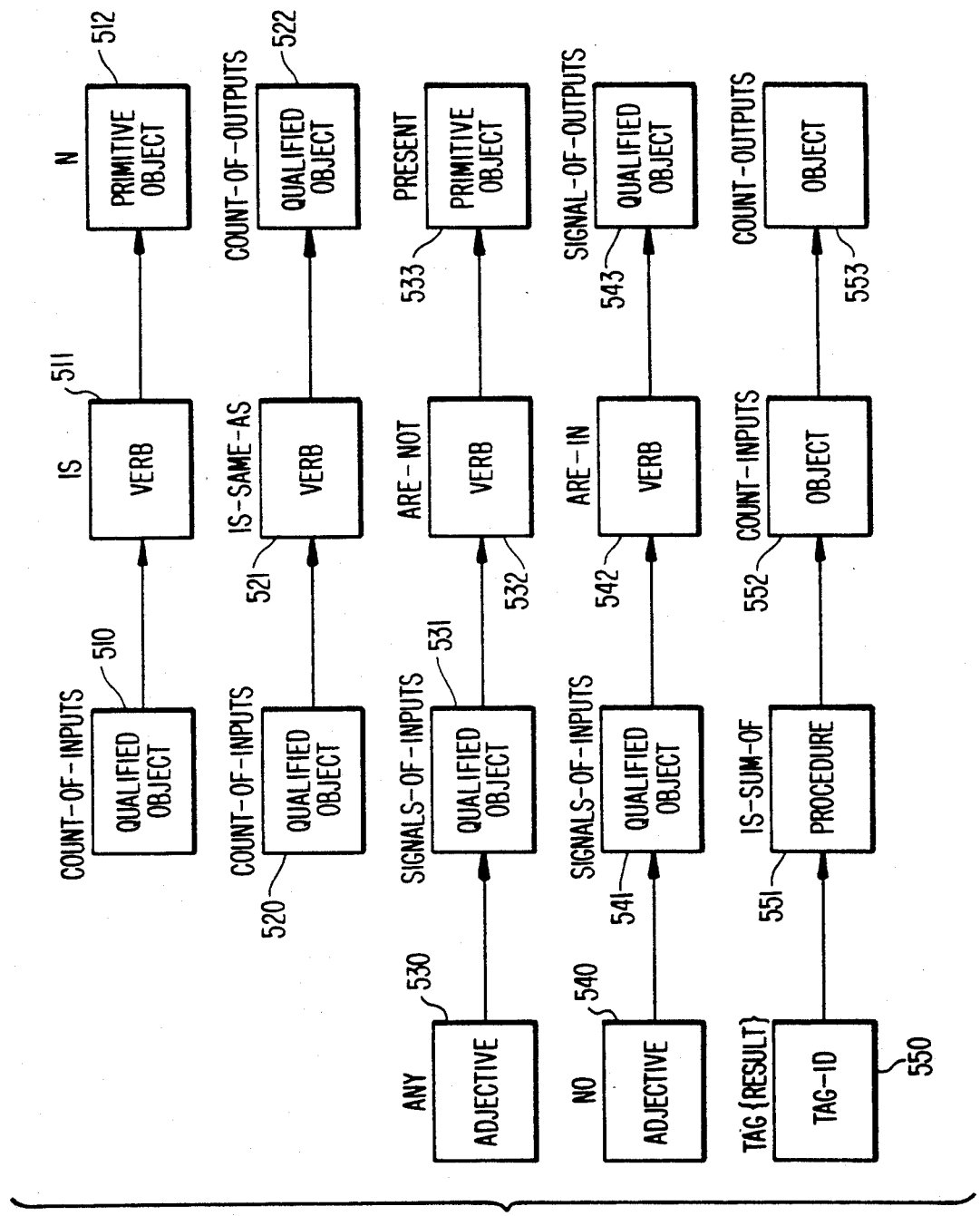
FIG. 5 illustrates the forms of the antecedent portion of the rule file according to the present invention.

Referring to FIG. 5, five examples of the antecedent field 43 of the rule structure 40 of (FIG. 4) are shown. In these examples, a qualified object is a database object at the end of an access chain for which the beginning is a current instance. A qualified object may be a plurality of qualified objects. A primitive is taken as is without further database access (e.g., a number is a primitive object). In the first example, (count-of-inputs is N), the qualified object 510 is followed by a verb 511 followed by a primitive object 512. If the current instance has N inputs, then this antecedent will return a 'true' when evaluated. Otherwise, the antecedent will return a 'nil' when evaluated. In the second example, (count-of-inputs is-same-as count-of-outputs), the qualified object 520 is followed by a verb 521 which, in turn, is followed by a qualified object 522. In the third example, (any signals-of-inputs are-not present), an adjective 530 is followed by a qualified object 531, in turn followed by a verb 532, which in turn is followed by primitive object 533. This field is interpreted as follows: When any of the inputs of the current instance is not coupled to a signal, the antecedent will return a "true" value. In example four, (no signals-of-inputs are-in signal-of-outputs), an adjective 540 is followed by a qualified object 541, which is in turn, is followed by a verb 542, which is in turn followed by a qualified object 543. In the fifth example, (tag{result} is-sum-of count-inputs count-outputs), a value{result} 550 is stored that is the result of of a called procedure 551 involving a designated number of arguments 552 and 553. This procedure call permits LISP functions to be used by a rule antecedent field. The arguments 552, 553 et al. can be primitive objects or qualified objects. The name{result} can be used during the remainder of the rule antecedent field procedure and consequence field procedures to fetch the value stored under that name. The number of possible tags is not limited and all tag storage is erased when the antecedents portion of the rule is false or at the completion of the consequences portion of the rule. This type of antecedent always returns a true (T) value, regardless of the value of the tag field. In the preferred embodiment, it is possible to use keywords (tag1, tag2, etc.) and to refer to them directly as in the expressions:

```
(tag{result} is_sum_of count_inputs
count_outputs
({result} is_less_than N)
``` which can also be expressed:

```
(tag1 is_sum_of count_inputs count_outputs)
(tag1 is_less_than N)
```

Rule antecedents can also be nested by using the boolean terms 'AND' or 'OR'. This nesting can be done in LISP format. For example:

```
(or (count_ins_is less than N)
({result} is_less than N))
```

Figure 6:
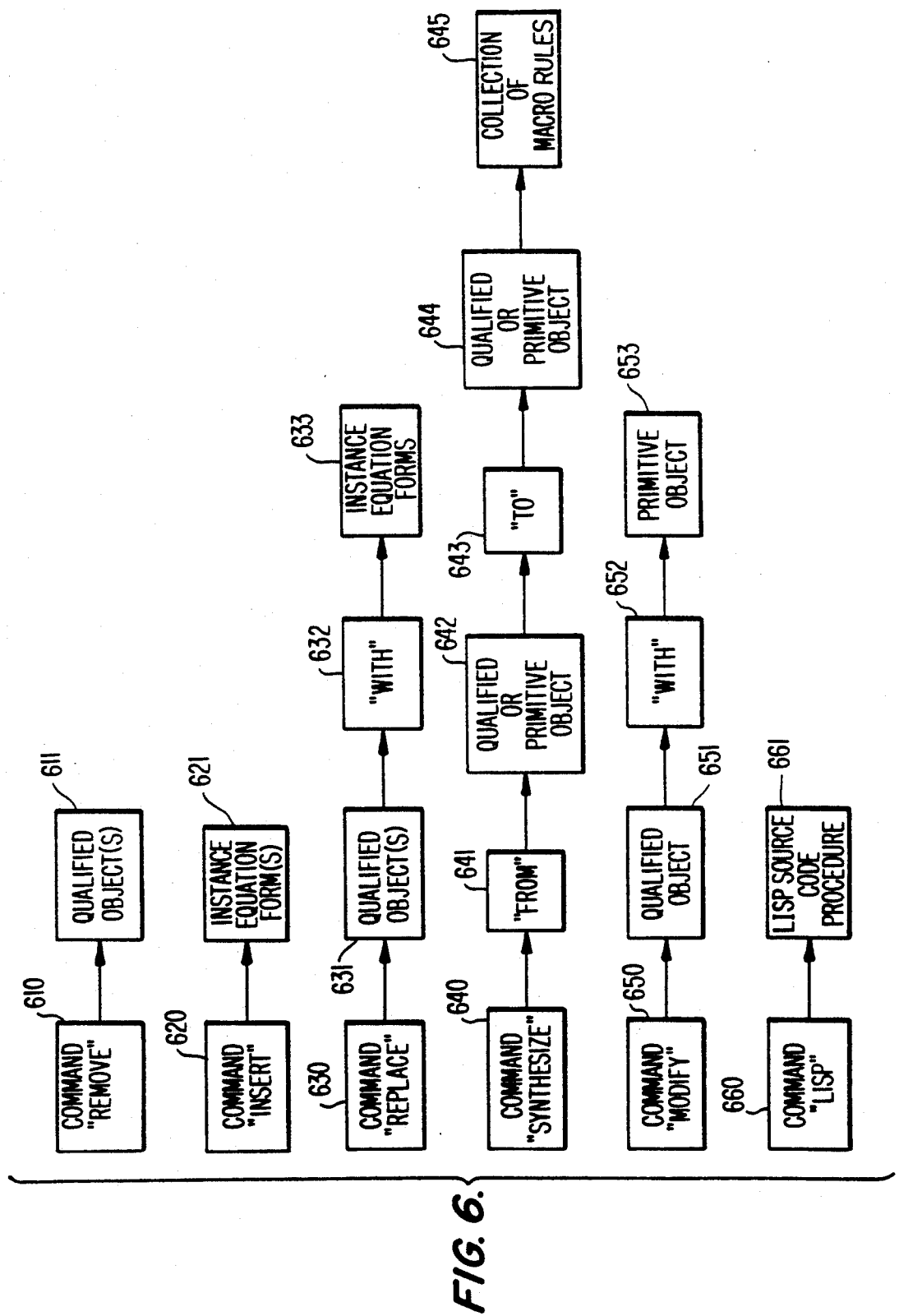
FIG. 6 illustrates the forms of the consequence portion of the rule file according to the present invention.
Figure 7A:
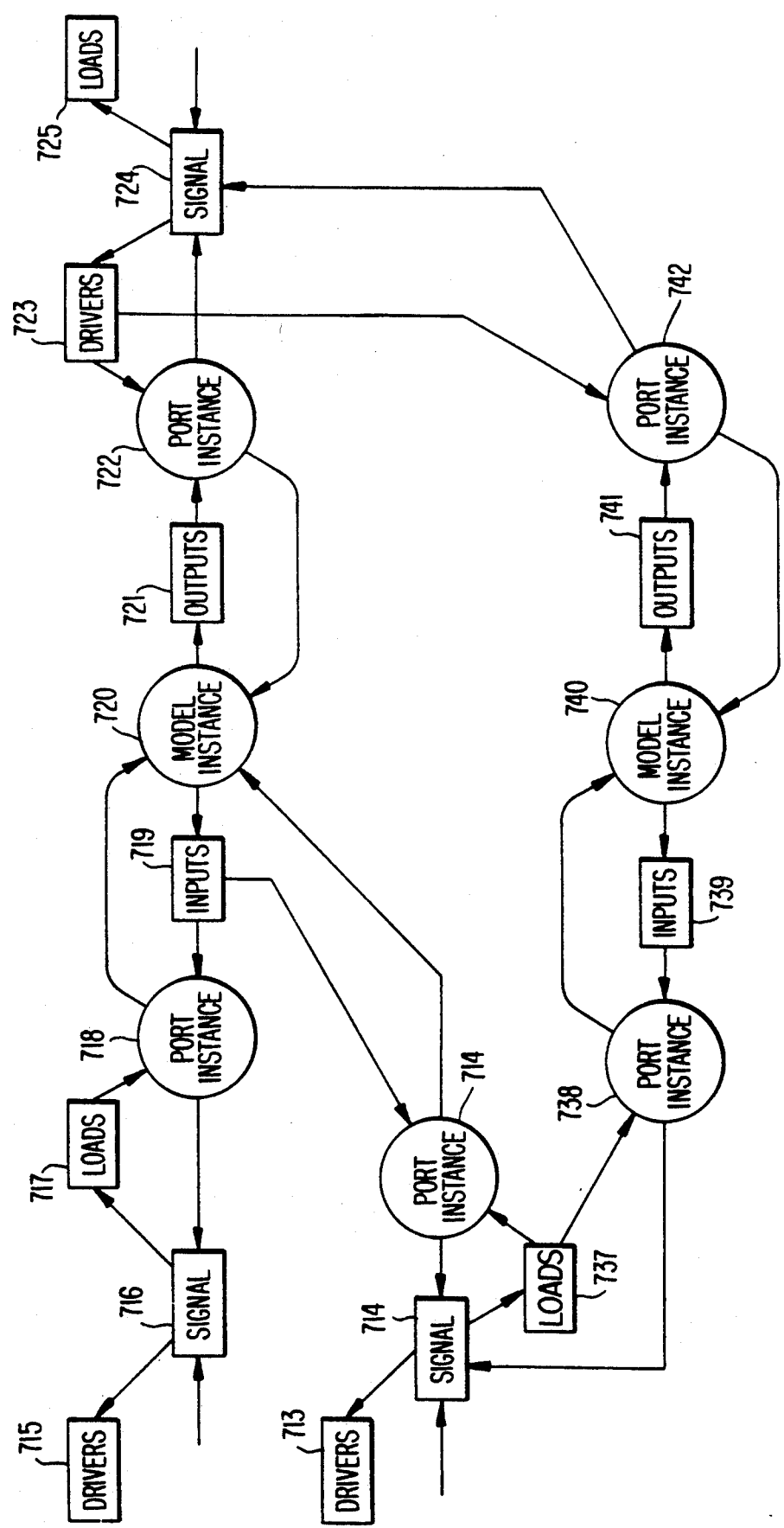
FIGS. 7A and 7B illustrate the remove, insert and replace operations of the synthesis procedure according to the present invention.

Referring next to FIG. 6, the structure of the consequence field of the rule 40 (FIG. 4) is illustrated by six examples. In the first example, the command "remove" or "remove-if-no-dests" 610 is used to remove one or more instances 611 from the instances of the current model definition. FIG. 7A shows two model instances 720 and 740, which will be used to explain application of the rule consequence in FIG. 6. Referring to FIG. 7A, model instance 720 has outputs 721, which, in turn has a port instance 722. Port instance 722 is a driver 723 of signal 724, signal 724 having loads 725. Model instance 720 also has inputs 719 which has port instances 718 and 714. The port instances are loads 717 and 737 of signals 716 and 714, respectively. Signals 716 and 714 have drivers 715 and 713, respectively. Model instance 740 has outputs 741, which, in turn, have port instance 742 associated therewith. Port instance 742 is also a driver of signal 724. Model instance 740 has inputs 739 which has a port instance 738, the port instance being another load of 737 of signal 714.

Figure 7B:
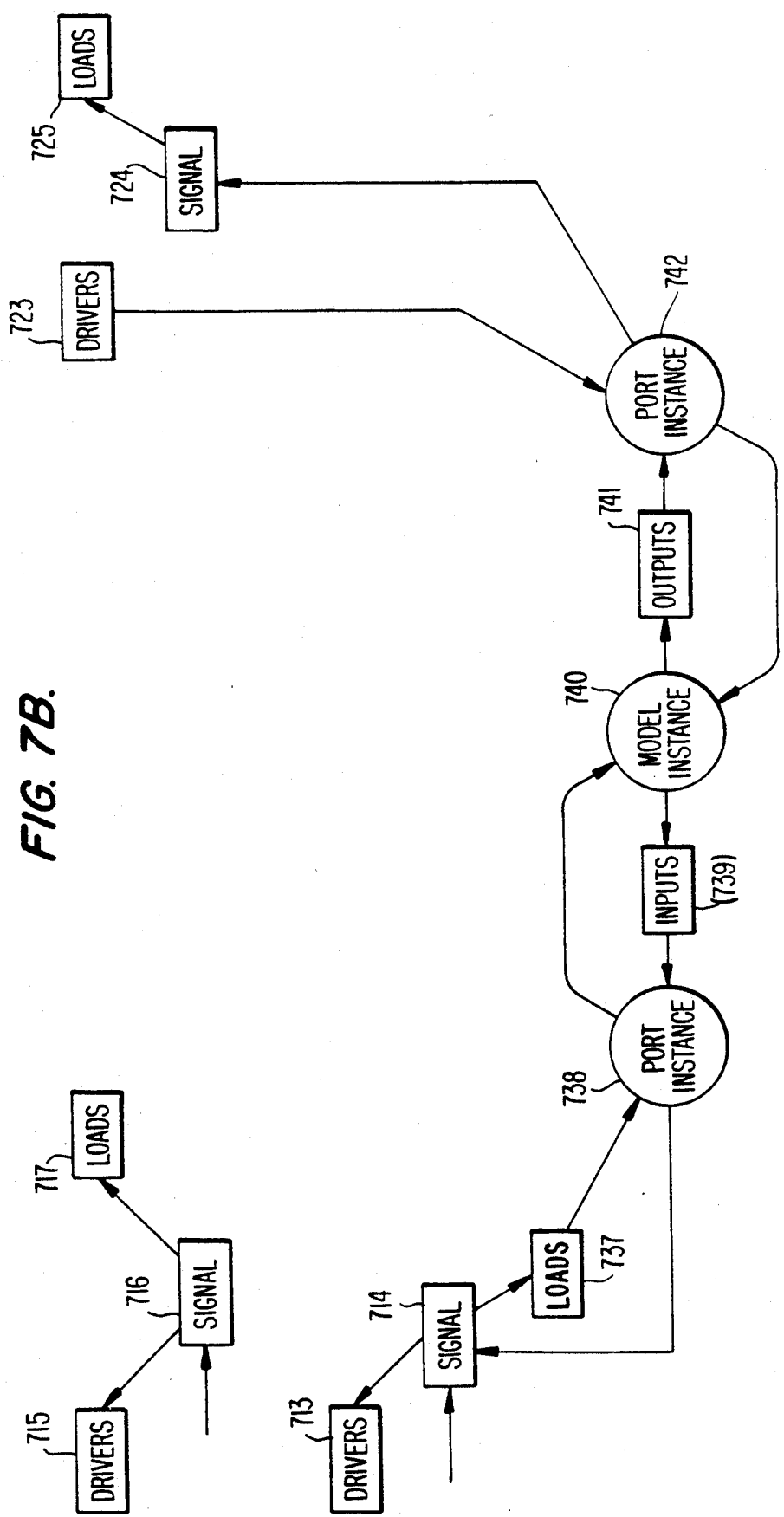

When a 'remove' command, as shown in FIG. 6, identifies a qualified object to be removed, the model instance 720 is removed and the database pointers are revised to reflect the new connectivity as shown in FIG. 7B. The pointers of model instance 720 and its interfaces 719, 718, 714, 721 and 722 are removed and the space in the storage files previously used by these removed elements is made reusable. As a result, signal 724 is left with only one driver 723 from port instance 742, signal 716 is left with no loads 717 and signal 714 is left with one load 737 associated with port instance 738.

In the second example of FIG. 6, the 'insert' command 620 is used to perform the reverse of the 'remove' command 610. In this example, the connectivity of FIG. 7B can serve as a starting configuration, model instance 720 being inserted and new pointers being added to achieve the connectivity as shown in FIG. 7A. The argument to the 'insert' command is a suitable equation form 621 with optional settings of database attributes to the instances being inserted. The insertion of a model instance is described in detail in the co-pending Patent Application entitled "Rule Structure for Insertion of New Elements in a Circuit Design Synthesis Procedure" identified above.

The third example shown in FIG. 6 illustrates the 'replace' command 630. This command is combined with the 'remove' and the 'insert' command to remove one or more qualified model instance objects 631 and then to insert one or more model instance objects derived from equation form 633. Operation of the 'replace' command should be intuitive from the above description of the 'delete' and 'insert' commands.

The fourth example of FIG. 6 illustrates the form of the 'synthesize' command 640. This command is used for complex multibit synthesis in which the current instance operated upon by the rule has the attributes of the most significant bit and the least significant bit, as is common in high level specifications of digital designs. An example of such a device is a 32 bit incrementer, which can have a most significant bit of 31 and a least significant bit of 0. In this example, following the 'synthesize' command is the keyword 'from' 641, followed by access to the most significant bit 642. The most significant bit 642 is followed the keyword 'to' 643, followed by access to the least significant bit 644 and finally followed by a collection of rules 645. This collection of rules is described in detail in the Patent Application entitled "Bitwise Implementation Mechanism for Rules Utilized by a Synthesis Procedure for Logic Circuit Designs", identified above.

Figure 8:
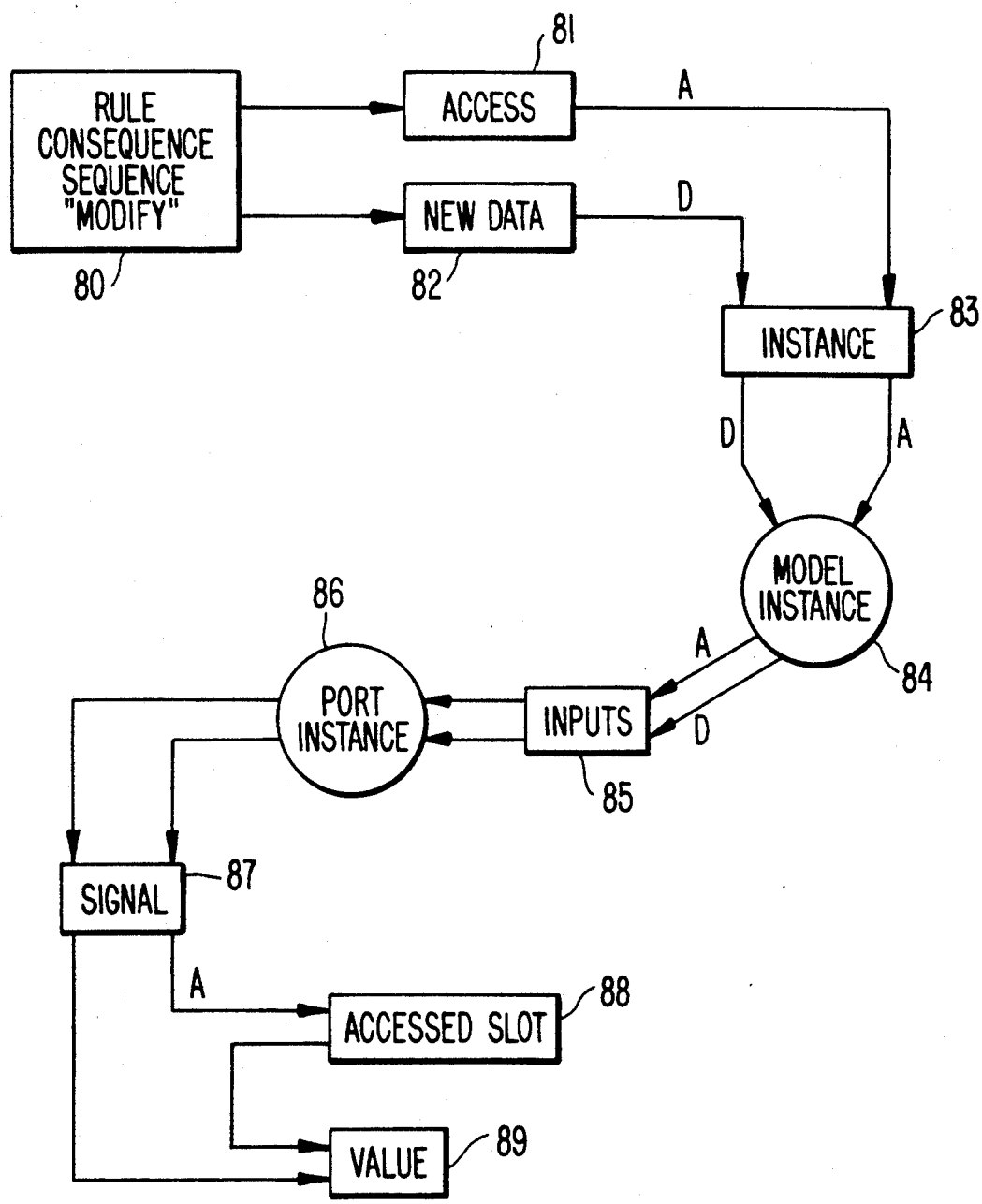
FIG. 8 illustrates the modification of a primitive data base object by a rule according to the present invention.

The fifth example of FIG. 6 identifies the form of the 'modify' command 650. This command is used to alter a database object by setting its value. The 'modify' keyword is followed by a qualified object 651, the qualified object being followed by the by the keyword 'with' 652. The keyword 'with' is then followed by a primitive object 653. FIG. 8 illustrates a 'modify' operation of a rule consequence 80. In this example, The qualified object 651 of FIG. 6 is a design database access 81 in FIG. 8. The primitive object 653 of FIG. 6 is new data 82 in FIG. 8. The access path A leads from the current model instance holder 83 to the current instance 84 and then to its inputs 85. From the inputs 85. one of which is a port instance 86 the access path A leads to its signal 87 and then to an attribute holder such as accessed slot 88 for signal 87. The new data is passed along the access path until the accessed slot or attribute holder 88 is reached. where it is finally bound as the attribute value 89.

The sixth example of FIG. 6 uses the 'LISP' keyword to permit entry of a lisp procedural expression 661. This procedural capability provides additional flexibility to modify the design database.

2. Operation of the Preferred Embodiment

Referring once again to FIG. 3, the system is initialized by creating the rules bases and the primitive model definitions. The pointers coupling the design data with the rules are then installed through a "pointification" process. Rules may identify a relationship of a model definition by naming the model definition. Rules that do not name a model definition, if not associated with a model instance, are global design rules. The collection of rules for each model definition 317 are found in the rule table of each rule base. Pointers are established to point to the collection of rules and to the rule table 305. The rules of model definitions are organized into subgroups indexed by rule base names. When a rule does not identify a relationship to an object, a pointer pointing to the rule is placed in the rules of current design.

After the rule bases and the model definitions have been entered. the entry form of the logic design map is entered into the model definition table 314. The entry includes the interface specification, the model instances and their connectivity, and other attributes. Any model instance model instance may also name rules of model of model instances 321 to be applied only to that model instance. The related rule is found in the rule table 305 and a pointer to the rule is established. The two hierarchies are interrelated by pointers from the logic design map to the rules of design, rules of model definitions and rules of model instances.

A model definition is entered by an external software mechanism and inserted into the internal data structures. The model definition is placed in the models definition table of the current design (i.e., Table 314 in FIG. 3). Pointers are added. Data structures with the internal references described above provide a system of accessible logic elements on which the logic synthesis rules can operate. The rules that embody design knowledge can number in the hundreds. A rule can have an antecedent activity and a consequent activity. Typically in rule-base software, the antecedent activity acts as a predicate to test the working data and should the predicate return a 'true' value, the consequent activity serves to change the working data. However, unlike previous ruled based software systems which store the working data in a non-hierarchical memory table, the data to be operated upon in the instant invention is the hierarchical database itself. Also, unlike the previous rule-based design systems in which the entire rule set is scanned sequentially, in this system, the model instances are scanned in parallel and for each instance, the small subset of rules associated with the model instance is scanned. As is characteristic of rule-based systems, the consequences of several rules can return a true verdict, and an arbitration rule mechanism used for conflict resolution chooses the rule to be applied. In the present invention, the best rule for each model instance is chosen in parallel and applied.

The textual format of the rule is:

```
(p "name of rule"
            "optional comments"        :optional
            (antecedent)
            (antecedent)
            (et al.)
            →
            (set_size_win <number>)    :optional
            (consequence)
            (consequence)
            (et al.)
)
```

When '(set-size-win <number>)' is present after the → symbol, then the sizewin field 47 of the rule is set to <number>. Otherwise, a rule complexity number is derived from the number of model instance objects identified in the consequences and that number is placed in the sizewin field 47.

It will be clear that the rules in the preferred embodiment operate on model instances, which are design elements such as digital parts or functional blocks. The starting point for access to the database by the rule is the current instance, from which it is possible to follow pointers along the connectivity paths of the logic design.

With reference to FIG. 5 and FIG. 6, the antecedent procedures of a rule never modify the logic design database, whereas the consequence procedures of the rules always modify the logic design database.

The grammar of rule antecedents is illustrated below in Backus-Naur form space 1, ::= are meta-symbols for the Backus-Naur Form formalism, and not symbols of the language, and <,> are used to identify symbols used to describe the derivation of strings that this language can generate:

```
<number>     ::= a LISP number
<char_string> ::= a string of characters delimited by
                 double quotes
<expression> ::= a quoted LISP expression
<function>   ::= a defined LISP function
<arguments>  ::= LISP function arguments
<prime-obj>  ::= an intermediate object
                 <number> 1 <char-string> 1 <expression> 1
                 boolean 1 true 1 present 1 nil
<qualified-obj> ::= an access syntax to identify a
                    path to a logic design database
                    object relative to the current
                    instance
<tag-obj>    ::= name of local storage for the rule to
                 keep temporary objects
<adjective>  ::= a qualifier for a set of objects
                 any 1 all 1 no 1 any_or_no 1 found 1
<verb>       ::= a comparison function, i.e.,
                 is 1 are 1 is_same_as 1 is_not 1 are_not 1
                 is_greater_than 1 is_less_than 1 is_member 1
                 are_member 1 is_not_member 1 are_not_member 1
                 are_set_equal 1 are_set_equal_to 1 is_in 1
                 is_not_in 1 has_profile 1
<antecedent> ::= <qualified-obj> <verb> <prim-obj> 1
                 <qualified-obj> <verb> <qualified-obj> 1
                 <adjective> <qualified-obj> <verb>
                     <prim-obj> 1
                 <adjective> <qualified-obj> <verb>
                     <qualified-obj> 1
                 <tag-obj> <function> <& rest arguments> 1
```

The grammar of rule consequences is illustrated below in the Backus-Naur form

```
<command>    ::= remove 1 insert 1 replace 1
                 remove_if_no_dests 1 synthesize 1 modify 1
```

```
                    LISP 1
<inst-obj> ::= is an object or list of objects of
type model instance
<equation> ::= one or more equations with optional
               'modify' statement after each
<procedure> ::= a LISP expression
<consequence> ::= remove <inst-obj>
              ::= insert <equation>
              ::= replace <inst-obj> with <equation>
              ::= remove_if_no_dests <inst-obj>
              ::= synthesize from <qualified-obj> to
                  <qualified-obj> <rules>
              ::= modify <qualified-obj> with
<prim-obj>
              ::= lisp procedure
```

The foregoing description is included to illustrate the operation of the preferred embodiment and is not meant to limit the scope of the invention. The scope of the invention is to be limited only by the following claims. From the foregoing description, many variations will be apparent to those skilled in the art that would yet be encompassed by the spirit and scope of the invention.

What is claimed is:

1. A procedure implemented by a data processing system for execution of rules stored in a memory in said system related to model structures used in automated synthesis of logic circuits, the procedure comprising the steps, performed by the data processing system, of:

relating, by the data processing system, at least one rule to said model structure by means of data base pointers;

executing, by the data processing system, a first portion of each related rule to determine if a first condition is present;

prioritizing, by the data processing system, the related rules in which the first condition is present such that the rules are associated with different priorities;

selecting, by the data processing system, one of said related rules, according to the priority associated with each of said related rules, when a plurality of rules determines that said first condition is present; and implementing, by the data processing system, a second portion of said selected rule to perform said logic circuit synthesis.

2. A method for automatic synthesis of a logic circuit formed of circuit components that are to be interconnected in a desired manner, the circuit components being represented by model instances, the method being implemented by a data processing system having a memory for storing a database corresponding to the logic circuit being synthesized, the method comprising the steps, performed by the data processing system, of:

storing, by the data processing system, in the memory data corresponding to (1) the model instances, (2) sets of predetermined rules associated with each model instance, each rule including an antecedent portion and a consequence portion, and (3) the desired interconnections;

testing, by the data processing system, for each model instance and its placement in the logic circuit according to the desired interconnections, the antecedent portion of the rule associated therewith;

prioritizing, by the data processing system, the rules whose antecedent portions have been found to be true by the testing step;

executing, by the data processing system, according to priority as determined by the prioritizing step, the consequence portion of each rule whose antecedent portion is found to be true by the testing step; and modifying, by the data processing system, in accordance with the execution of the consequence portion in the executing step, the database in the memory that is descriptive of the logic circuit to perform synthesis of the logic circuit.

3. The method recited in claim 2, wherein the step of testing includes the step of recording information regarding the history of useage of the rule.

4. The method recited in claim 3, wherein the step of testing the antecedent portion involves either of two different types of objects, a primitive object requiring no access to the database and a qualified object requiring access to the database.

5. The method recited in claim 4 wherein the step of testing includes reference to a first qualified object followed by a verb followed by reference to one of a primitive object and a second qualified object.

6. The method recited in claim 5 wherein the step of testing includes reference to an adjective prior to referencing said first qualified object.

7. The method recited in claim 4 wherein the step of testing includes reference to a tagged object followed by a function followed by at least one of a primitive object and a qualified object.

8. The method recited in claim 4 wherein the step of executing comprises designating at least one qualified object and performing a command in said consequence portion indicative of an activity involving said qualified object.

9. The method recited in claim 8 wherein said activity comprises at least one of removing, inserting and replacing involving said qualified object.

10. The method of claim 9 wherein the step of executing further comprises the steps of designating a preposition and identifying at least one other qualified object to be involved in said activity.

11. The method of claim 4 wherein the step of executing comprises the step of synthesizing the designated qualified object from at least one other qualified object.

12. The method of claim 2 wherein the step of modifying the database involves replacing at least one model instance in the database with another model instance.

* * * * *